US008895209B2

(12) United States Patent
Kang et al.

(10) Patent No.: US 8,895,209 B2
(45) Date of Patent: Nov. 25, 2014

(54) MASK FOR USE IN PHOTOLITHOGRAPHY, MANUFACTURING METHOD THEREOF AND MANUFACTURING METHOD OF DEVICES BY USING THE MASK

(75) Inventors: Min Kang, Seoul (KR); Jong Kwang Lee, Daejeon (KR); Jin Ho Ju, Seoul (KR); Bong-Yeon Kim, Seoul (KR); Hyang-Shik Kong, Seongnam-si (KR); Kyoung Sik Kim, Seoul (KR); Seung Hwa Baek, Incheon (KR)

(73) Assignee: Samsung Display Co., Ltd. (KR)

( * ) Notice: Subject to any disclaimer, the term of this patent is extended or adjusted under 35 U.S.C. 154(b) by 47 days.

(21) Appl. No.: 13/565,659

(22) Filed: Aug. 2, 2012

(65) Prior Publication Data

US 2013/0143149 A1   Jun. 6, 2013

(30) Foreign Application Priority Data

Dec. 2, 2011   (KR) .................. 10-2011-0128486

(51) Int. Cl.
*G03F 1/00* (2012.01)

(52) U.S. Cl.
USPC .................................................. 430/5

(58) Field of Classification Search
CPC ............... G03F 1/00; G03F 1/38; G03F 1/50; G03F 1/68
USPC ........................................ 430/5; 355/78, 80
See application file for complete search history.

(56) References Cited

U.S. PATENT DOCUMENTS

| 7,352,941 | B2 | 4/2008 | Bratkovski et al. |
| 7,421,178 | B2 | 9/2008 | Podolskiy et al. |
| 7,718,326 | B2 | 5/2010 | Stenger |
| 8,574,792 | B2 * | 11/2013 | Lee et al. ............... 430/5 |
| 2007/0159617 | A1 * | 7/2007 | Mackey ............... 355/80 |
| 2009/0040132 | A1 | 2/2009 | Sridhar et al. |
| 2009/0080070 | A1 | 3/2009 | May et al. |
| 2010/0033701 | A1 * | 2/2010 | Lee et al. ............... 355/67 |
| 2010/0134898 | A1 | 6/2010 | Shalaev et al. |
| 2010/0157437 | A1 | 6/2010 | Higginson et al. |
| 2012/0156594 | A1 * | 6/2012 | Lee et al. ............... 430/5 |
| 2014/0127612 | A1 * | 5/2014 | Kang et al. ............... 430/5 |

FOREIGN PATENT DOCUMENTS

KR   1020110027543 A   3/2011

OTHER PUBLICATIONS

J.B. Pendry, "Negative Refraction Makes a Perfect Lens", Physical Review Letters, Oct. 30, 2000, vol. 85, No. 18, 4 pages.
Nicholas Fang et al., "Sub-Diffraction-Limited Optical Imaging with a Silver Superlens", www.sciencemag.org, Apr. 22, 2005, vol. 308, 4 pages.
Richard J. Blaikie et al., "Imaging through planar silver lenses in the optical near field", J. Opt. A: Pure Appl. A, Opt. 7 S176, Journal of Optics, (2005), 9 pages.
Kwangchil Lee et al., "Active phase control of a Ag near-field superlens via the index mismatch approach", Applied Physics Letters 94, School of Mechanical Engineering, Yonsei University, (2009), 3 pages.

* cited by examiner

*Primary Examiner* — Stewart Fraser
(74) *Attorney, Agent, or Firm* — Innovation Counsel LLP

(57) ABSTRACT

Provided are a photomask, including: a substrate; an opaque pattern formed on the substrate and made of a material which does not penetrate light; a first dielectric layer formed on the substrate and the opaque pattern; and a negative refractive-index meta material layer formed on the first dielectric layer, in which a dispersion mode used in the photomask uses a Quasi bound mode, a manufacturing method of the photomask, and a manufacturing method of a substrate using the photomask.

5 Claims, 22 Drawing Sheets ns applica
MASK FOR USE IN PHOTOLITHOGRAPHY, MANUFACTURING METHOD THEREOF AND MANUFACTURING METHOD OF DEVICES BY USING THE MASK

CROSS-REFERENCE TO RELATED APPLICATION

This application claims priority to and the benefit of Korean Patent Application No. 10-2011-0128486 filed in the Korean Intellectual Property Office on Dec. 2, 2011, the entire contents of which application are incorporated herein by reference.

BACKGROUND (a) Field of Disclosure

The present disclosure of invention relates to a mask for use in a photolithography process, a manufacturing method for producing the mask and a manufacturing method for producing other devices by use of the mask.

(b) Description of Related Technology

In recent times, flat panel display devices have been differentiated and developed in various ways. Examples of flat panel display devices include various display devices such as large display area liquid crystal displays (LCD's), organic light emitting displays (OLED's), electrophoretic displays, MEMS displays (e.g., tilted micro-mirrors), and various forms of 3D displays (e.g., those using active shutters or those which otherwise project different images to the left and right eyes). Technological advances have been made in each of these respective fields. The technological advances include greater miniaturization as well increased display area.

With such technological advances, a need has emerged to form ever more minute patterns of electronic circuitry or the like in the flat panel display assemblies while at the same time enlarging the total display area of the device. In the flat panel display device industry, unlike the VLSI semiconductor industry, since there is little need to improve integrability by the forming of minute patterns throughout large display areas, it was not heretofore been required to form minute patterns which exceed the limited resolution of a legacy light exposer used in the meantime within the industry where the legacy light exposer produces light outputs over a relatively broad spectrum of wavelengths (a.k.a. herein as "complex light") as opposed to coherent light with a specific single wavelength.

However, as flat panel display devices have been further developed, cases have come into the limelight where a need arises for forming components of a minute pattern format in a pixel or in another part of a display panel where the minute pattern has a resolution which exceeds the limited resolution capabilities of the legacy light exposer which produces light output over a relatively broad spectrum of wavelengths (a.k.a. "complex light").

One possible answer to the emerging industry needs is to switch to the use of the more expensive, single wavelength light exposers where the latter have the capability of providing a substantially higher resolution. That is, when a light source used in the light exposer is changed to the higher resolution kind or when a Numerical Aperture value of the light exposer increases, the resolution can be improved. However, since the legacy light exposers used to manufacture display devices output complex wavelengths light having a plurality of light wavelengths, there is a cost and other problems attached to switching to use of a single wavelength light source. More specifically, such a switchover requires not only modification of the light exposer itself, but also introduction of new facilities structured to operate with the single wavelength exposer. Therefore, such a switchover requires a lot of cost and time. Further, since the changing to the single wavelength light source and the increase in the NA value can reduce a depth of focus, there is a problem in that danger of a failure will increase due to nonuniformity across the entire display device area where in the display device industry is trending towards use of larger-area substrates as opposed to the substantially smaller substrates as occurs in the shrinking die size realms of the VLSI semiconductor device industry.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a mask for use in photolithography, and in particular for use with light exposers that output a complex wavelengths light having a plurality of light wavelengths such as the legacy light exposers previously used to manufacture display devices. The here disclosed photomask and its methods of use have the advantage of being able to form minute patterns which exceed a limited resolution of a legacy light exposer without replacing the legacy light exposer.

An exemplary embodiment of the present invention provides a photomask irradiating light emitted from a light exposer using a light source having complex wavelengths to a work target, including: a substrate; an opaque pattern formed on the substrate and made of a material which does not pass light; a first dielectric layer formed on the substrate and on the opaque pattern; and a negative refractive-index meta material layer formed on the first dielectric layer. A dispersion mode photolithography is used where the photomask operates in a Quasi bound mode.

More specifically, in the Quasi bound mode, as a value of a spatial frequency kx (e.g., measure in inverse nanometers or $nm^{-1}$) decreases, the energy eV of an associated electromagnetic wave may increase.

The negative refractive-index meta material layer used in the photomask may have a negative refractive index in a scope in which the spatial frequency kx has a low value.

Yet more specifically, the value of the low spatial frequency kx may be in the range of 0.005 to 0.03 $nm^{-1}$.

A gap distance (d) between an uppermost, photosesnsitive layer of the work target and the photomask may be more than 0 and equal to or less than 35 μm.

The photomask may further include a second electric layer formed on the negative refractive-index meta material layer.

Another aspect of the present disclosure of invention provides a manufacturing method for the making of a photomask in accordance with the present teachings, the method including: forming an opaque pattern on a substrate by using a material which does not pass light; forming a first dielectric layer on the substrate and on the opaque pattern; and forming a negative refractive-index meta material layer on the first dielectric layer. The photomask is structured to operate in a dispersion mode and to use a Quasi bound mode.

The photomask may further include a second dielectric layer formed on the negative refractive-index meta material layer.

Yet another aspect of the present disclosure of invention provides a photolithography method that uses the novel photomask disclosed herein where the photolithography method includes: positioning the photomask between a substrate as a work target including a photoresist and a light exposer having a light source of complex wavelengths; transferring some of light to the photoresist by irradiating light to the photomask from the light exposer; and developing the photoresist, where the photomask includes a substrate; an opaque pattern formed on the substrate and made of a material which does not pass light; a first dielectric layer formed on the substrate and the opaque pattern; and a negative refractive-index meta material layer formed on the first dielectric layer. The photomask is structured to operate in a dispersion mode and to use a Quasi bound mode.

A gap distance (d) between the photoresist of the substrate as the work target and the photomask may be more than 0 and equal to or less than 35 µm.

According to one aspect of the present disclosure of invention, it is possible to form a pattern which is more minute than previously thought possible for the limited resolution of a legacy light exposer without replacing or modifying the legacy light exposer. This is done by using the here disclosed photomask, thereby reducing costs.

The operation of the photomask is believed to include the inducing of surface Plasmon resonance or phonon resonance at a dielectric to other interface where the other is a meta material having a negative refractive index. This combination acts as a Quasi bound mode optical lens that allows the photomask to achieve a high resolution over a refractive limit by restoring (rejuvinating) via the negative refractive index effect, an evanescence wave that is otherwise exponentially decayed according to a propagation distance of the corresponding electromagnetic wave.

DETAILED DESCRIPTION

Figure 1:
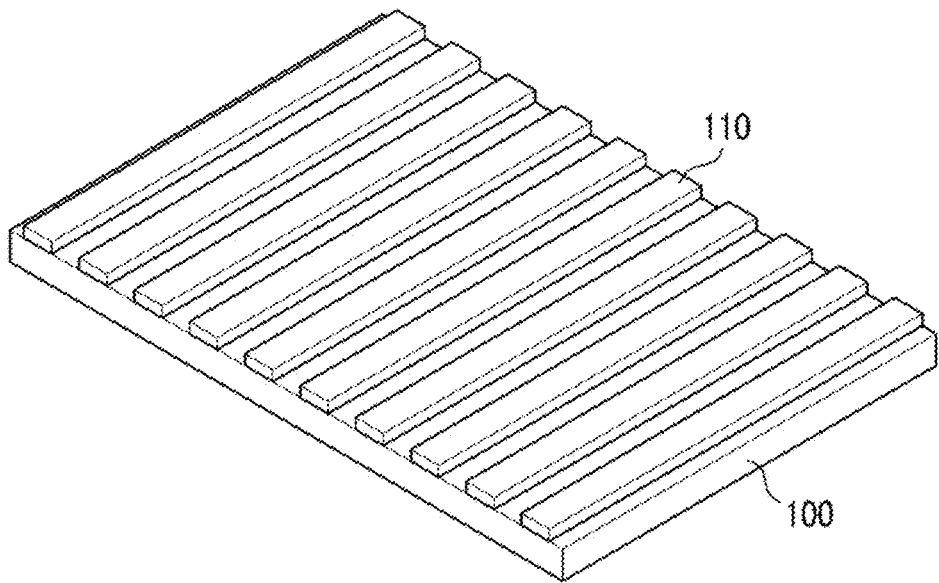
FIGS. 1 to 4 are perspective views respectively illustrating a sequence of manufacturing steps for formin a photomask according to an exemplary embodiment in accordance with the present disclosure of invention.

The present disclosure of invention will be described more fully hereinafter with reference to the accompanying drawings, in which exemplary embodiments of are shown. As those skilled in the art would realize after reading this disclosure, the described embodiments may be modified in various different ways, all without departing from the spirit or scope of the present disclosure of invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a photomask and a manufacturing method thereof according to exemplary embodiments of the present disclosure of invention will be described in detail with reference to FIGS. 1 to 5.

FIGS. 1 to 4 are perspective views illustrating a sequence of manufacturing steps for making a photomask according to an exemplary embodiment of the present disclosure. FIG. 5 is a perspective view illustrating a photomask according to another exemplary embodiment.

Figure 4:
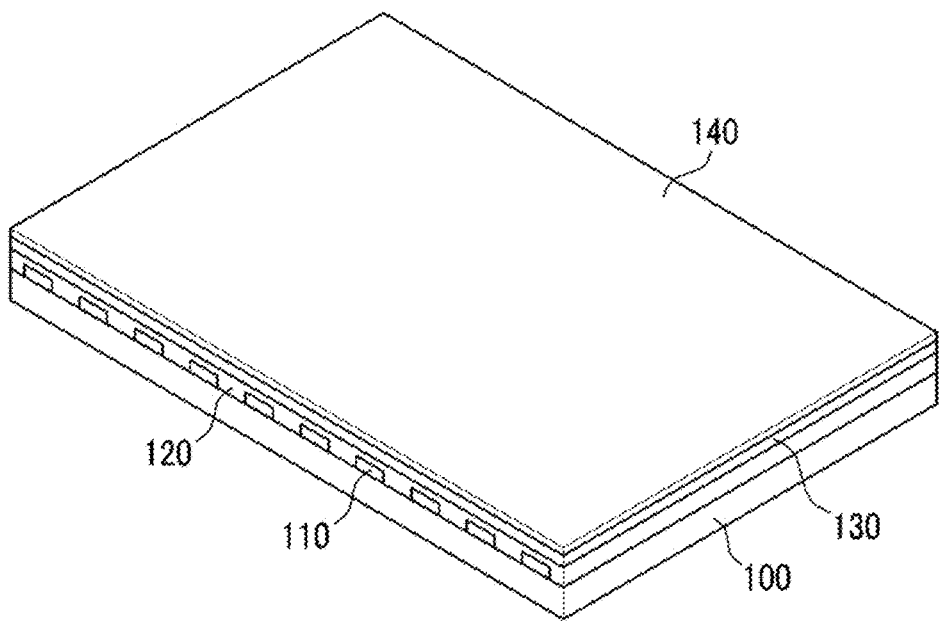
Figure 5:
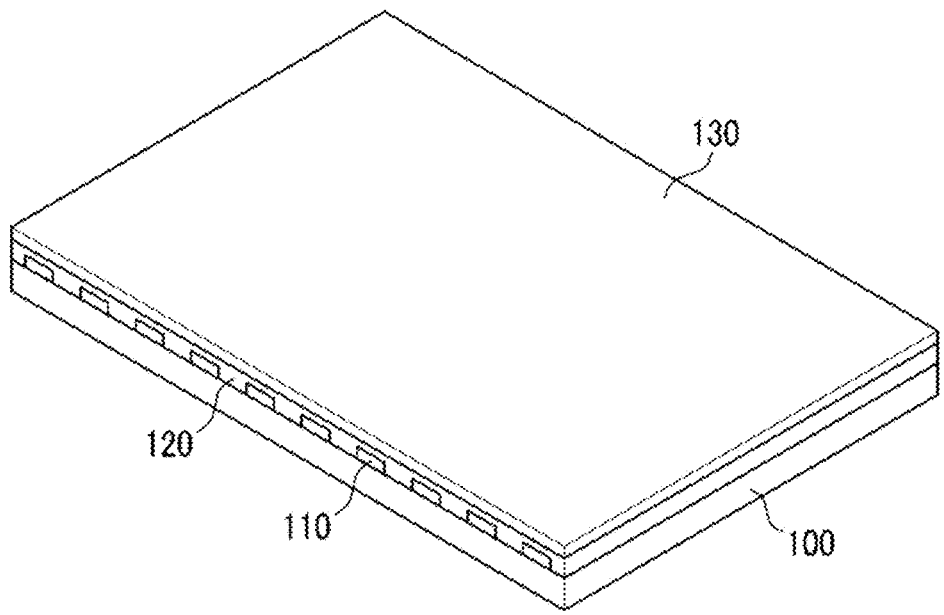
FIG. 5 is a perspective view illustrating a photomask according to another exemplary embodiment.

First, referring to FIG. 4, where a first photomask according to an exemplary embodiment is shown, the illustrated first photomask comprises an opaque pattern 110 which may be formed as a layer and is used for selectively blocking parts of a transmitted complex light (not yet shown). The opaque pattern 110 may include chrome and may be formed on a light-passing substrate 100 such as one made of quartz, and the like. The illustrated first photomask further comprises a first dielectric layer 120 covering the substrate 100 and filling in gaps within the opaque pattern 110 as well as covering the opaque pattern 110.

On top of the first dielectric layer 120 there is formed, a negative refractive-index meta material layer 130. The meta material layer 130 is relatively thin as will be detailed below and may be made of a metal that provides a negative refractive-index function. A second dielectric layer 140 is optionally provided covering the negative refractive-index meta layer 130.

In the photomask according to the exemplary embodiment of FIG. 4, the light-passing substrate 100 and the opaque pattern 110 function as general (i.e. conventional) optical mask structures. On the other hand, the first dielectric layer 120, the negative refractive-index meta material layer 130, and the second dielectric layer 140 are positioned thereon are dimensioned so as to operate in a quantum mechanical fashion whereby a near-field evanescence wave effect is exploited. More specifically, a metal to dielectric boundary is formed and surface Plasmon waves are believed to be induced in the metal layer side of the metal/dielectric boundary. A corresponding evanescence wave is induced as a near-field effect in the dielectric side of the metal/dielectric boundary. The induced evanescence wave typically exponentially decays in intensity as a function of propagation distance of an electromagnetic wave away from the metal/dielectric boundary. However, due to operations of the photomask in a socalled, Quasi bound mode, an effective focal point of a lensing function provided by the photomask can be translated as far as 35 nm (gap distance d) beyond the photomask and onto a photo-sesnsitive surface.

Since only one dielectric layer is actually needed for defining the metal/dielectric boundary and generating the surface Plasmon or phonon waves, one embodiment of the photomask may omit the second dielectric layer 140. In other words, in some exemplary embodiments, the second dielectric layer 140 is optional and is omitted for example in the exemplary embodiment shown in FIG. 5.

In the photomask according to the exemplary embodiment of FIG. 5, the opaque pattern 110 for blocking light, such as one composed of chrome, is formed on the substrate 100 made of quartz or a like broadband, light-passing medium. The first dielectric layer 120 is then formed to cover the substrate 100 and the opaque pattern 110. The negative refractive-index meta material layer 130 is next formed to cover the first dielectric layer 120. The meta material layer 130 is made of a metal useful in inducing surface plasmons, for example gold or silver. The metal is formed so as to provide a negative refractive-index function.

First, the manufacturing method of the photomask according to the exemplary embodiment of the present disclosure of invention will be described in more detail with reference to FIGS. 1 to 4.

As shown in FIG. 1, the opaque pattern 110 is formed on the substrate 100 made of quartz. The opaque pattern 110 is made of chrome and may have various shapes including light blocking areas and light passing areas according to a shape of a pattern to be formed by a photolithography process on a traget surface where the photolithography process exploits a Plasmon resonance or phonon resonance induced in the photomask of the present disclosure. In FIG. 1, the opaque pattern 110 is schematically shown as a pattern of spaced apart linear stripes. However, other patterns may be used depending on the end pattern desired to be formed in the target photoresist. Since the forming of the opaque pattern 110 made of chrome (for example) on a quartz (for example) substrate 110 is a basic manufacturing method in the photomask forming arts, specifics of the method will not be further described in detail herein.

Figure 2:
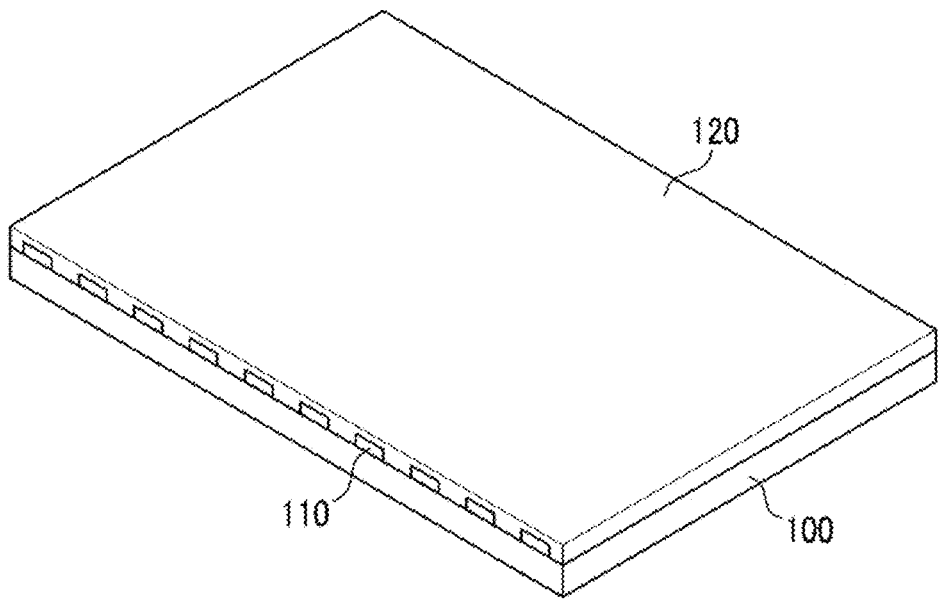

Thereafter, as shown in FIG. 2, the first dielectric layer 120 is formed on the substrate 100 and on the opaque pattern 110, for example by a spin coating method. The first dielectric layer 120 may be made of various, light-passing dielectric materials, but in the exemplary embodiment, polymethyl methacrylate (PMMA) is used. The first dielectric layer 120 may have a thickness in the range of 10 to 500 nm and may be formed to have a similar thickness (same order of magnitude) to that of the next-to-formed, negative refractive-index meta material layer 130.

Figure 3:
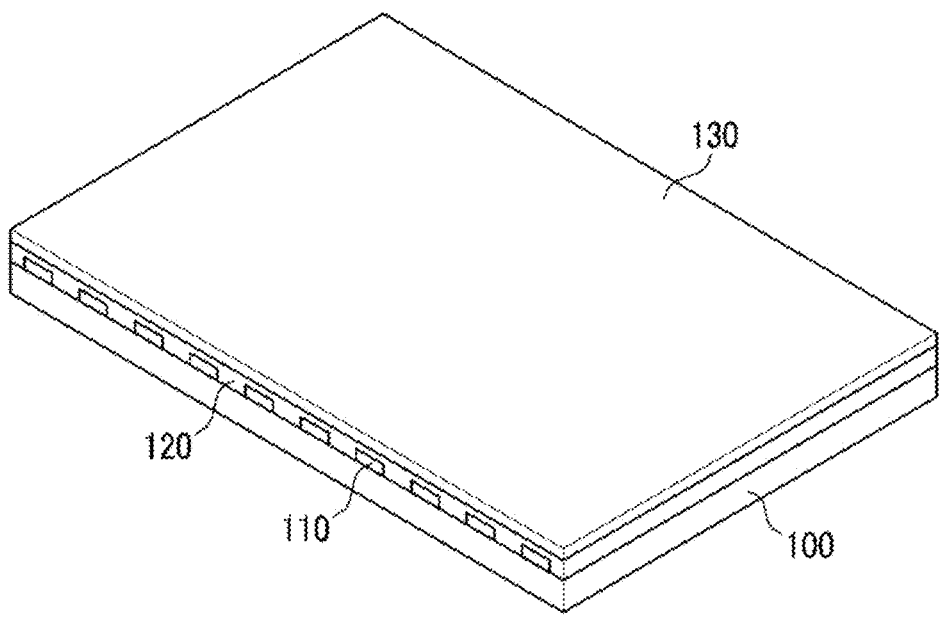

Thereafter, as shown in FIG. 3, the negative refractive-index meta material layer 130 made of an appropriate metal is formed on the first dielectric layer 120 for example by way of an E-beam evaporation method and it may be patterned to function as a negative refractive-index meta material. Usable metallic materials may be various materials useful for inducing a Plasmon resonance or phonon resonance effect and for exhibiting negative refractive-index meta material behavior such as silver, gold, a high conductivity/high reflectivity aluminum, and the like. In the exemplary embodiment, silver (Ag) is used. It is deposited and patterned so as to define the negative refractive-index meta material layer 130 as one having a thickness in the range of 10 to 150 nm.

Thereafter, as shown in FIG. 4, the second dielectric layer 140 is formed on the negative refractive-index meta material layer 130 for example by a spin coating method. The second dielectric layer 140 may also be made of various light-passing dielectric materials like those used for the first dielectric layer 120. In the exemplary embodiment, the second dielectric layer 140 is formed of polymethyl methacrylate (PMMA). The second dielectric layer 140 may have a thickness in the range of 10 to 500 nm and may be formed to have a similar thickness to the negative refractive-index meta material layer 130.

Since the first dielectric layer 120 should be formed while filling the height of the openings in the opaque pattern 110 by spin coating, the spin coating may be performed several times to assure a uniform and planar top surface. On the contrary, the second dielectric layer 140 of FIG. 4 may be formed even by one-time spin coating.

Flatness of each respective one of the first dielectric layer 120, the negative refractive-index meta material layer 130, and the second dielectric layer 140 may have a value equivalent to ⅕ to 1/10 of each respective thickness.

Meanwhile, the photomask according to the exemplary embodiment of FIG. 5 is formed by only the processes of FIGS. 1, 2, and 3 and the process of FIG. 4 is not used. In the photomask according to the exemplary embodiment of FIG. 4, the sum of the thicknesses the first dielectric layer 120 and the second dielectric layer 140 may be the same as the thickness of the first dielectric layer 120 in the photomask according to the exemplary embodiment of FIG. 5. This is to make optical characteristics between two masks for photolithography coincide with each other, and as a result, the first dielectric layer 120 according to the exemplary embodiment of FIG. 5 has a thickness in the range of 10 to 1000 nm.

A photolithography process using the photomask including the negative refractive-index meta material layer 130 as described above will be described hereinafter with reference to FIGS. 6 to 9.

FIGS. 6 to 9 are perspective views illustrating steps of photolithography by using the photomask according to the exemplary embodiment of the present disclosure of invention.

Figure 6:
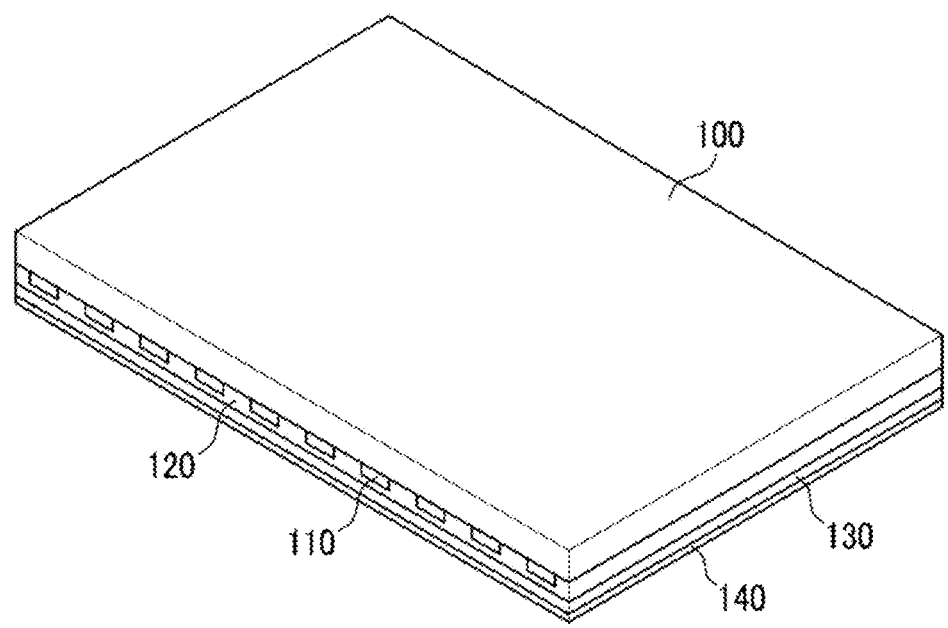
FIGS. 6 to 9 are perspective views illustrating steps of photolithography by using the photomask according to an exemplary embodiment of the present disclosure.

First, in FIG. 6, the photomask of FIG. 4 is now shown in an upside down configuration. The reason therefor is that the legacy light exposer will be described as being positioned above the upper part of the photomask and a work target will be described as being positioned below the lower part of the photomask during the described photolithography process. Of course, these postionings are for illustrative purpose only and the orientation of the various parts relative to an up versus down frame of reference may be varied as desired.

Figure 7:
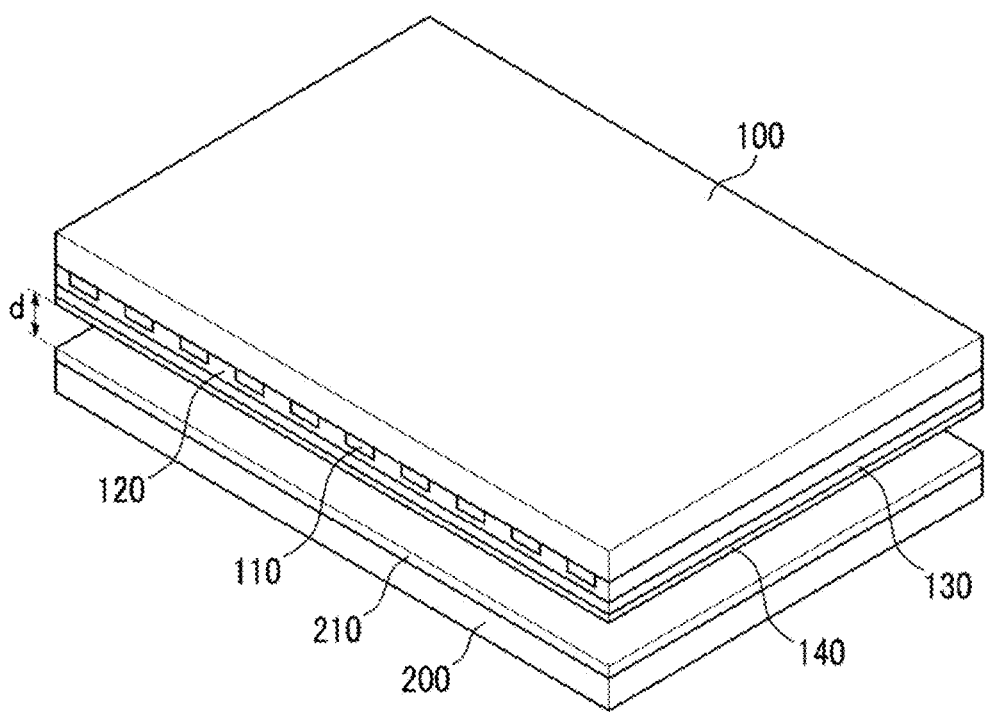

Referring to FIG. 7, a target substrate 200 having a photosenstive mask layer (e.g., photoresist) 210 and optionally a to-be-patterned layer beneath it (not shown) are positioned as a work target in spaced apart relation (e.g., gap d) from the lower part of the photomask. While the photoresist 210 stacked on the target substrate 200 is shown, the optional, to-be-patterned layer beneath; which optional to-be-patterned layer may be interposed between the target substrate 200 and the photoresist 210, is not shown for simplification of the figure.

Further, referring to FIG. 7, the photomask and the photoresist 210 are spaced apart from each other by a gap of distance value, d during the photolithography process according to the exemplary embodiment. The gap d is varied depending on the exemplary embodiment and its goals. In general, the gap distance value, d is larger than 0 but equal to or smaller than 35 µM (a.k.a. 35000 nm).

Figure 8:
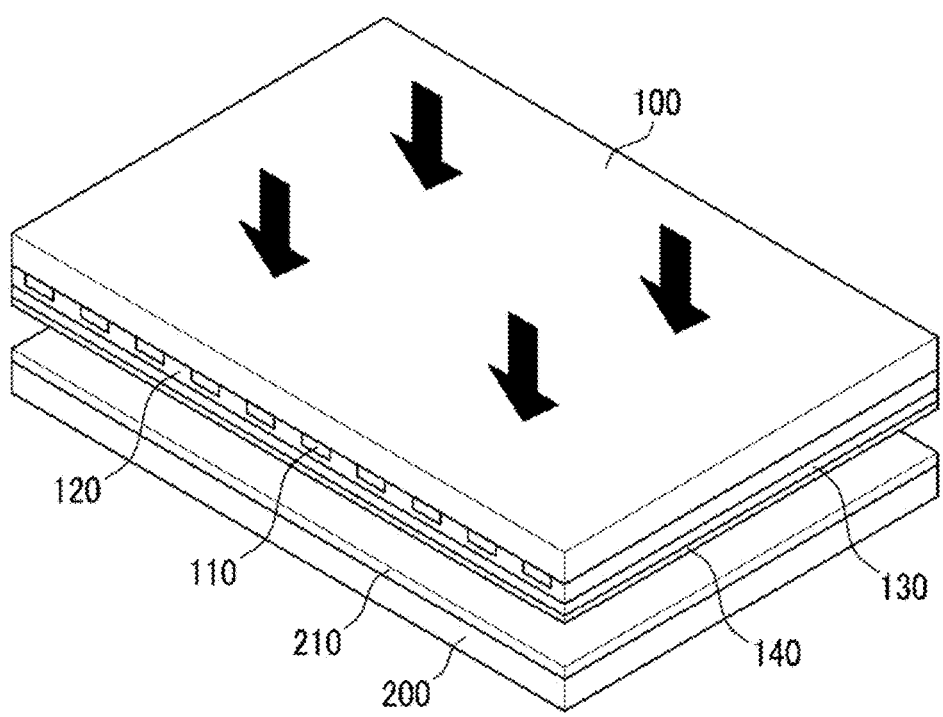

Thereafter, as shown in FIG. 8, when light is irradiated from a legacy light exposer (not shown) which is positioned above the upper part of the photomask, light energy is transferred through the unblocked areas where the opaque pattern 110 is not formed in the photomask. An evanescence wave is formed and selectively passed through in the unblocked areas where the optical energy of the evanescence wave is at least in part transferred to the photosesitive material of the photoresist 210. Of importance, the evanescence wave is not formed and is not propagagted in the blocked (opaque) areas. The evanescence wave is believed to be formed in the unblocked areas due to Plasmonic resonance or phonon resonance induced in the metal/dielectric interface(s) of the triple layer constituted by the first dielectric layer 120, the negative refractive-index meta material layer 130, and the second dielectric layer 140 (or alternatively, of the double layer constituted by the first dielectric layer 120 and the negative refractive-index meta material layer 130 in the case of the exemplary embodiment of FIG. 5).

Figure 9:
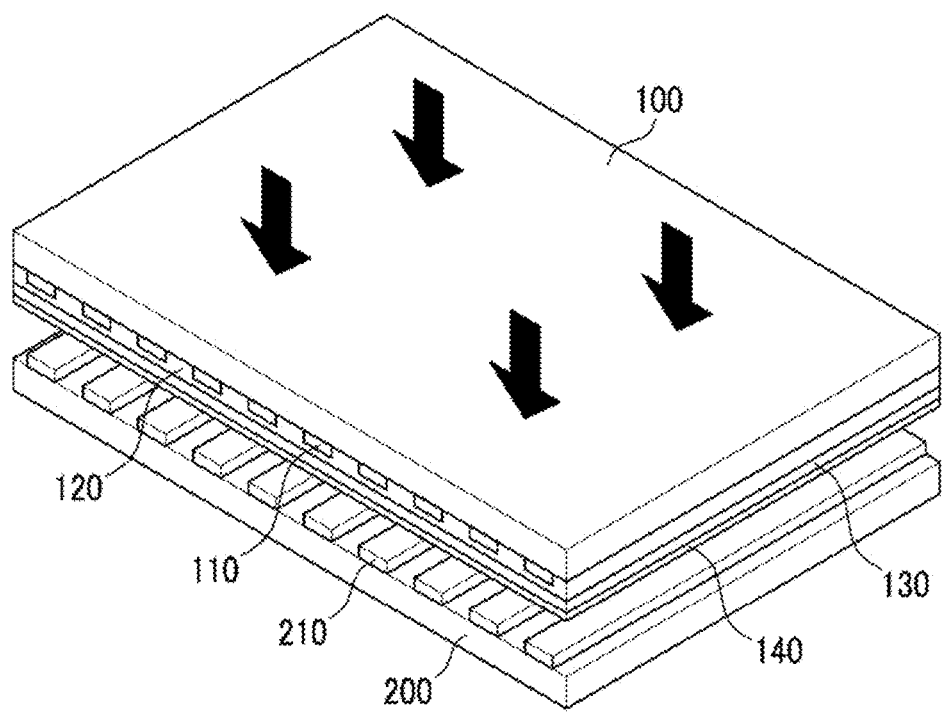
Figure 10:
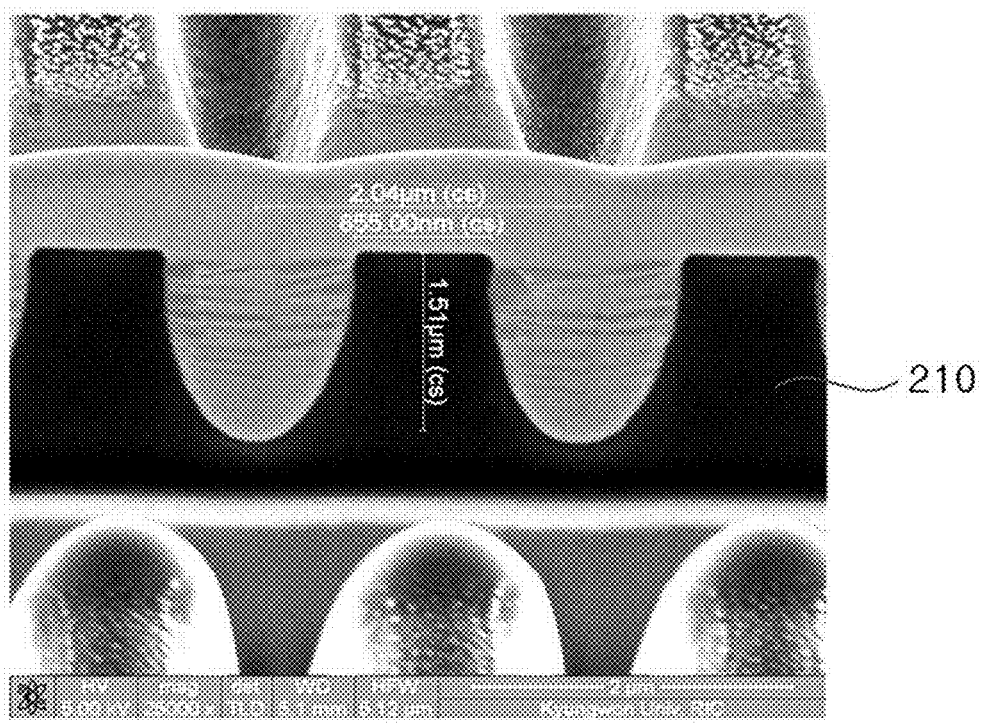
FIGS. 10 to 12 are micro-photographs illustrating a cross section of photoresist after actual photolithography and development by using the photomask according to an exemplary embodiment of the present disclosure.

As a result, when the photoresist 210 is later developed, and as is shown in FIG. 10; a minute pattern of micro-depressions which result from the formed and propagated evanescence wave appear in the developed photoresist 210 while no depression results for the area where the evanescence wave was not formed. The pitch (e.g., 2.04 μm in FIG. 10) of the formed micro-depressions may exceed a resolution limit of the legacy light exposer used in the photolithography process whose resultant product is schematically shown in FIG. 9.

In FIGS. 6 to 9, the photolithography process is described by using the photomask according to the exemplary embodiment of FIG. 4, but the photolithography process may also be performed by using the photomask according to the exemplary embodiment of FIG. 5.

The legacy light exposer used in the exemplary embodiments does not use light having a single wavelength but rather multi-mode light having complex wavelengths. That is, the light exposer uses a light source having the complex wavelengths of the G (435 nm), H (405 nm), and 1 (365 nm) lines.

A pattern of the photoresist 210 formed through the above steps will be described with reference to FIGS. 10 to 12.

Figure 11:
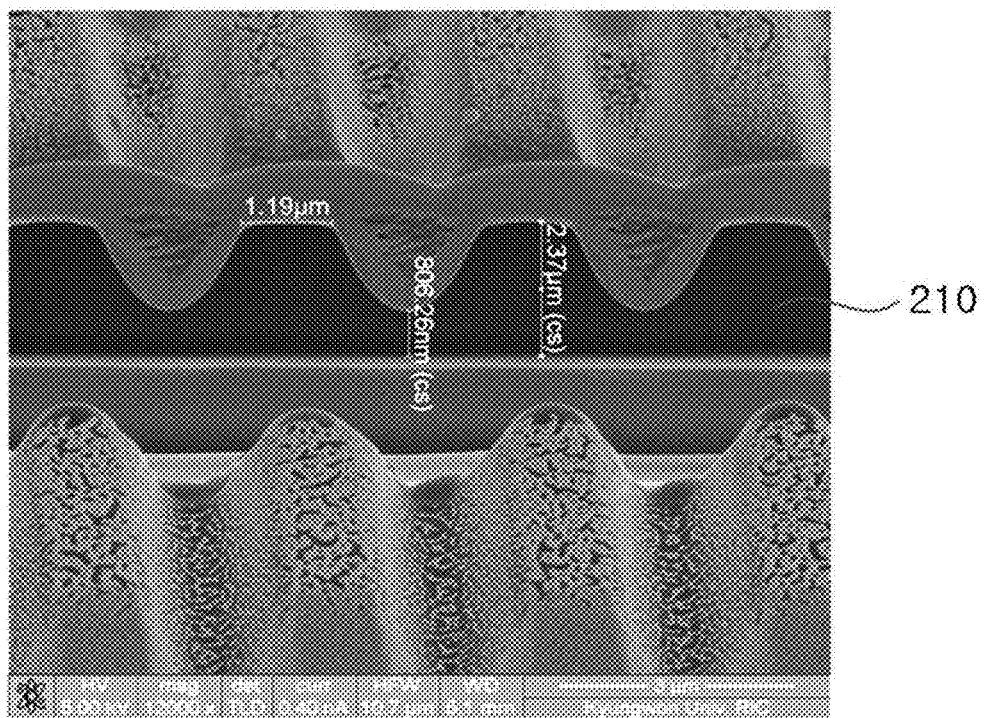
Figure 12:
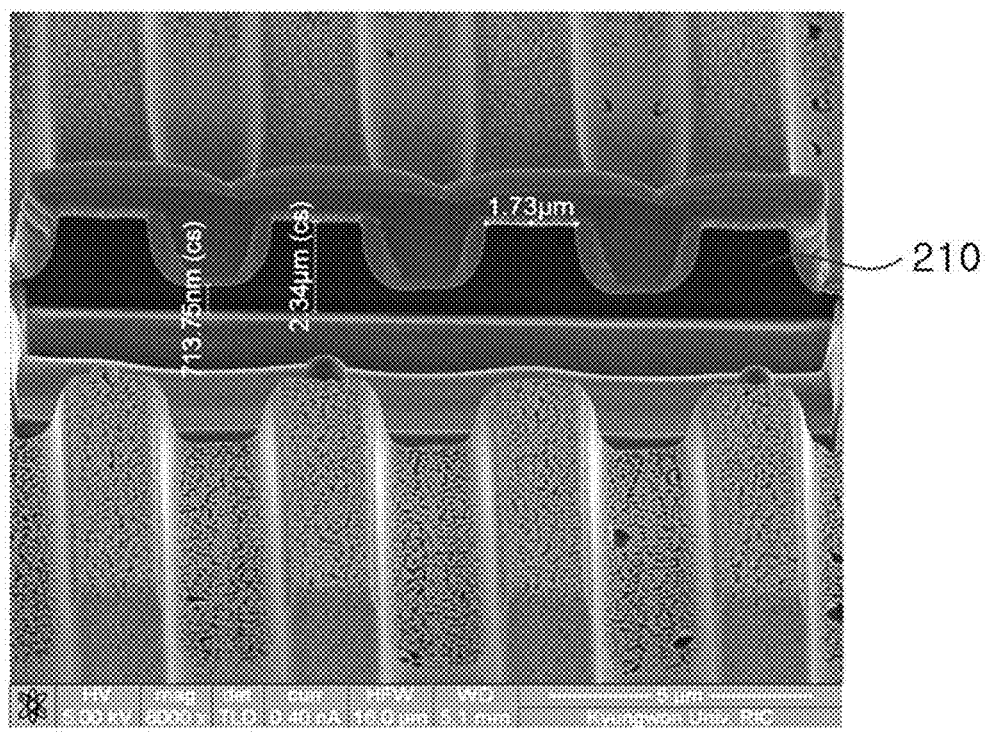

FIGS. 10 to 12 are microphotographs illustrating a cross section of photoresist after actual photolithography and development by using the photomask according to the above-described exemplary embodiment.

FIGS. 10 to 12 are photographs showing an actually experimented result through the steps of FIGS. 6 to 9 and in FIG. 10, it can be verified that a pattern in which the mesa width of the flat top surface mesa of the developed photoresist 210 is 855 nm and a pitch is 2.04 μm is formed. The width of the opaque pattern 110 and a gap between the opaque patterns 110 are 1 μm in the photomask used in the example of FIG. 10 this resulting in the observed pitch of 2.04 μm and depression depth of 1.5 μm seen in FIG. 10.

Further, in FIG. 11, where slightly different conditions were present, it can be verified that a pattern in which the mesa width of the top surface of the photoresist 210 is 1.19 μm is formed. In FIG. 11, the pitch is not measured, but the pitch is generally approximately twice the mesa width of the top surface, and as a result, the pitch is expected to be approximately 2.38 μm. The width of the opaque pattern 110 and the gap between the opaque patterns 110 are 1.5 μm in the photomask used in FIG. 11.

Further, in FIG. 12, where slightly different conditions were present, it can be verified that a pattern in which the mesa width of the top surface of the photoresist 210 is 1.73 μm is formed. Again, in FIG. 12, the pitch is not measured, but the pitch is generally approximately twice the width of the top surface, and as a result, the pitch is expected to be approximately 3.46 μm. The width of the opaque pattern 110 and the gap between the opaque patterns 110 are 2 μm in the photomask used in FIG. 12.

As shown in FIGS. 10 and 12, it can be verified that a pattern in which the pitch is in the range of approximately 2 to 3.5 μm is formed on the photoresist 210 after the photolithography process using the legacy light exposer. Since a limit pitch value of a pattern which can be formed is generally approximately 5 μm in the legacy light exposer using the complex wavelengths, it can be verified that a more minute pattern may be formed by the combination of the legacy light exposer and the photomask formed according to the exemplary embodiments taught herein.

Hereinafter, a computer simulation result for the photomask according to the exemplary embodiment will be described with reference to FIGS. 13 to 21.

First, the light intensity for the photomask according to the exemplary simulated embodiment will be described with reference to FIGS. 13 and 14.

Figure 13:
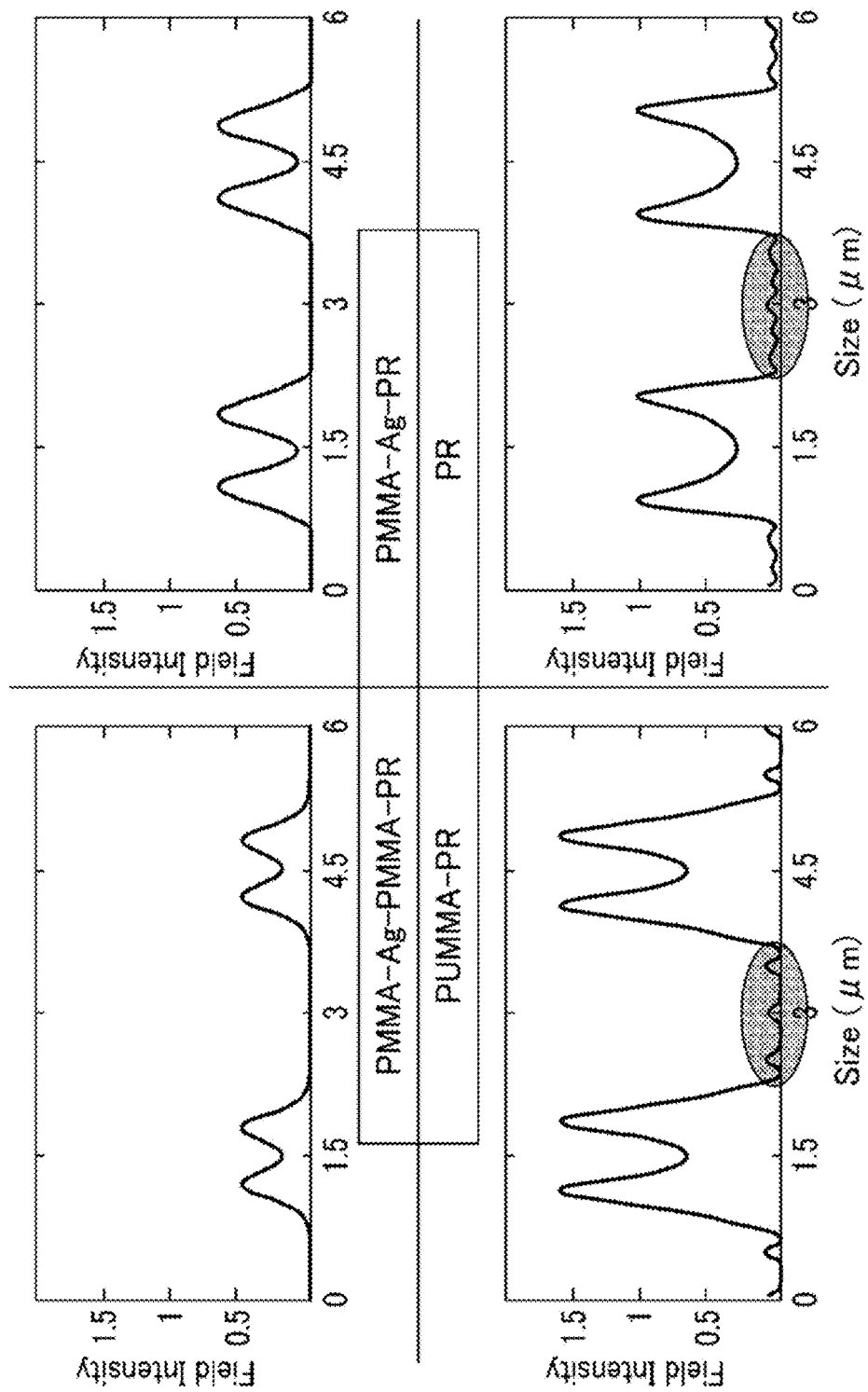
FIGS. 13 and 14 are micro-graphs illustrating a result of simulating the light intensity on the surface of photoresist in the case of using the photomask according to the exemplary embodiment.
Figure 14:
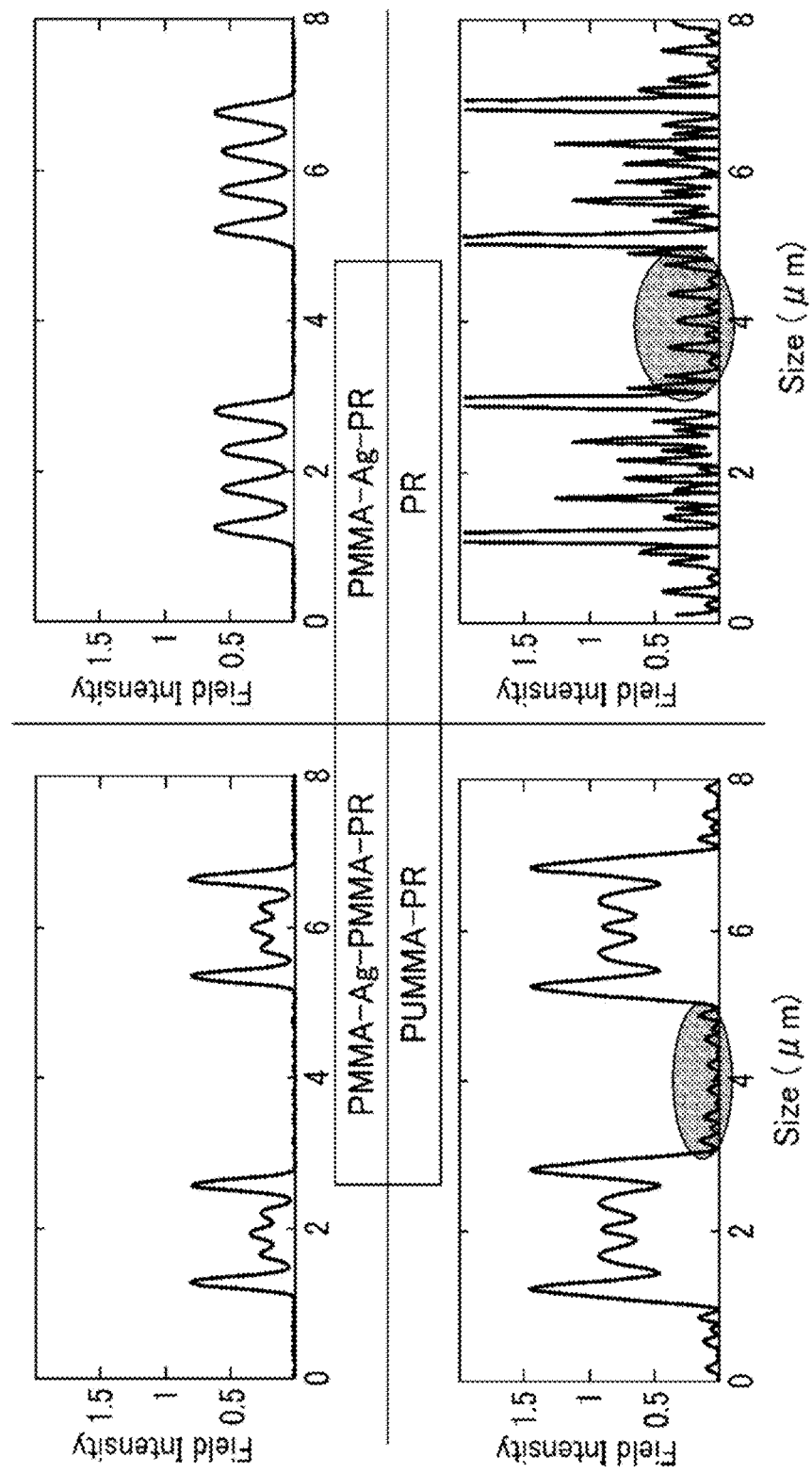

FIGS. 13 and 14 are graphs illustrating a result of simulating the light intensity on the surface of photoresist in the case of using the photomask according to the exemplary embodiments above where the goal is for the evanescence wave to be not formed and propogated into the photoresist where the source light is blocked by the opaque pattern 110.

First, in the graphs shown in FIGS. 13 and 14, a horizontal direction represents a lateral distance in the photoresist, the unit thereof is μm, and a vertical direction represents the intensity of a simulated electromagnetic wave propagated to the photoresist. The intensity of the electromagnetic wave is intensity as presented to the photosesntive material of the photoresist PR and thus causing change in the chemical composition of the photosensitive material of the photoresist.

Further, each of FIGS. 13 and 14 includes four graphs and in a graph positioned at an upper left side of each, the simulated photomask is configured to include the layers: PMMA-Ag-PMMA (in other words, the exemplary embodiment of FIG. 4 where the negative refractive-index meta material layer 130 includes silver). Further, in each of FIGS. 13 and 14, and more specifically in a respective graph positioned at an upper right side, the photomask includes PMMA-Ag (the exemplary embodiment of FIG. 5) and a state where the photoresist is developed after exposure is understood to correspond to the simulated field intensity. Meanwhile, in a graph positioned at a lower left side of the each of FIGS. 13 and 14 respectively, the photomask includes only PMMA and a state where the photoresist PR is formed is simulated therefor by the expected field intensity. Finally, in a graph positioned at a lower right side of the each of FIGS. 13 and 14 respectively, the photomask does not include even the PMMA dielectric. Basically the photomask is not there save for including only the substrate 100 and the opaque pattern 110 and a state where the photoresist is formed is simulated in that window portion of the figure.

First, FIG. 13 will be described in yet more detail. A case where the width of the opaque pattern 110 and the gap between the opaque patterns 110 are each 1.5 μm in the photomask is simulated in FIG. 13. The desired pitch is 3.0 μm.

As shown in FIG. 13, in two graphs shown in the upper side, an area which light penetrates and an area which light does not penetrate (and thus no evanescence wave is induced and propagated to the photoresist) are apparently distinguished from each other. More specifically, the opaque pattern 110 blocks light in the area around the 3 micron marker and the gaps let through light energy in the regions about the 1.5 micron and 4.5 micron markers. Therefore, the photoresist is apparently distinguished to form the pattern corresponding to the intensity of the evanescence wave induced and propagated to the photoresist. More specifically, in the regions about the 3.0 micron marker and for the case where the Ag negative refractive-index meta material layer 130 is included, light is effectively blocked from passing through due to what is believed to be the effect of no induction of surface Plasmon resonance or phonon resonance in that area.

However, in two graphs shown in the lower half of FIG. 13, it can be verified that, when the Ag negative refractive-index meta material layer 130 is not present, light energy partially penetrates (possibly due to defraction grating effects) even in an area about the 3.0 micron marker where the light should have been blocked by the overlying opaque pattern 110 (not shown). Since light is continuously irradiated during an actual photolithography process, partially penetrating light is continuously irradiated, such that light is irradiated to even a corresponding part in the photoresist, and as a result, the desired pattern (e.g., with flat topped mesas) is not clearly formed.

According to the simulation result in FIG. 13, when the photomask of FIG. 4 or FIG. 5 is provided according to the exemplary embodiments above, it can be verified that there is no light leakage problem in forming a pattern of 1.5 µM repeatedability (a pattern in which the pitch is approximately 3 µm).

Meanwhile, a case where the width of the opaque pattern 110 and the gap between the opaque patterns 110 are 2 µm in the photomask is simulated in FIG. 14 (leading to a pattern in which the pitch is approximately 4 µm).

In two graphs shown in the upper half of FIG. 14, an area which light penetrates and an area which light does not penetrate are apparently distinguished from each other at the respective markers for the 2 micron lateral distance, the 4 micron lateral distance, and the 6 micron lateral distance. Therefore, the photoresist is apparently distinguished to form the desired pattern. However, in two graphs at the lower half of FIG. 14, since light is not blocked, a developed photoresist of a clear pattern cannot be implemented.

Therefore, according to the result simulated in FIG. 14, when the photomask of FIG. 4 or 5 is used, it can be verified that there is no problem in forming a pattern of 2.0 µm repeatability (a pattern in which the pitch is approximately 4 µm).

Hereinafter, an optical characteristic of the photomask according to the exemplary embodiment will be described through an optical transfer function (OTF) for the electromagnetic wave with reference to FIGS. 15 to 23.

FIGS. 15 to 23 are graphs illustrating a result of simulating light penetrating the photomask according to the exemplary embodiment of the present disclosure by using equations.

In general, the optical transfer function (OTF) is used to measure image quality of an optical system and represented as shown in Equation 1 below.

$$OTF(k_x) = H_{img}/H_{obj} \quad [\text{Equation 1}]$$
$$= MTF(k_x)\exp[-iPTF]$$
$$= \exp(ik_z^{(1)}d_1)T_p(k_x)\exp(ik_z^{(2)}d_2)$$
$$= \frac{t_{1M}t_{M2}\exp(ik_z^{(1)}d_1)\exp(ik_z^{(2)}d_2)}{\exp(-ik_z^{(M)}d_M) + r_{1M}r_{M2}\exp(ik_z^{(M)}d_M)}$$

$$OTF(k_x) = H_{img}/H_{obj}$$
$$= MTF(k_x)\exp[-iPTF]$$
$$= \exp(ik_z^{(1)}d_1)T_p(k_x)\exp(ik_z^{(2)}d_2)$$
$$= \frac{t_{1M}t_{M2}\exp(ik_z^{(1)}d_1)\exp(ik_z^{(2)}d_2)}{\exp(-ik_z^{(M)}d_M) + r_{1M}r_{M2}\exp(ik_z^{(M)}d_M)}$$

That is, the optical transfer function (OTF) is represented by a ratio between a magnetic field $H_{img}$ of an imaging plane and a magnetic field $H_{obj}$ of an incident plane and is an equation indicating the light intensity after light penetrates a material. A result of solving the equation is expressed by $MTF(k_x)\exp[-iPTF(k_x)]$ as shown in Equation 1 above.

Herein, a modulation transfer function (MTF) is a value representing the magnitude of the optical transfer function (OTF) and a phase transfer function (PTF) represents the phase of the optical transfer function (OTF). Further, $k_x$ represents a spatial frequency and $k_z$ represents an information transfer wave vector (see Equation 2 below). Equation 1 above is generated based on a condition shown in FIG. 15.

Figure 15:
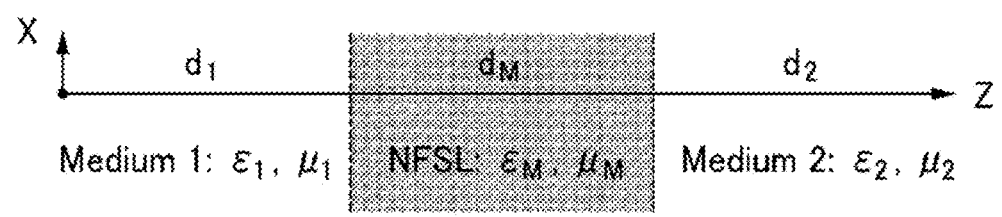
FIGS. 15 to 23 are graphs illustrating a result of simulating light penetrating the photomask according to the exemplary embodiment by using equations.

In FIG. 15, Medium 1 and Medium 2 may be considered as respectively corresponding to the first dielectric layer 120 and the second dielectric layer 140 in the photomask according to the exemplary embodiment described above, and an NFSL layer (Near Field Super Lens) interposed therebetween may be considered as corresponding to the negative refractive-index meta material layer 130.

When a value of the optical transfer function (OTF) is 1 in the spatial frequency kx in a wide range, the near field super lens (NFSL) becomes a perfect lens perfectly restoring information on an object plane on the image plane and has a resolution of approximately 1/(Δkx). Therefore, as a research tendency up to now, in an index matching method (a method of matching the magnitudes of real number parts of refractive indexes or dielectric constants of the negative refractive-index metal material and a positive refractive-index material covering the periphery thereof), a lot of efforts to improving the modulation transfer function (MTF) has been exerted in order to acquire a perfect lens condition.

However, in the photomask according to the exemplary embodiment of the present disclosure, the index matching method is not used for the negative refractive-index meta material layer 130. In this case, image blurring by absorption of the electromagnetic wave in a medium inevitably occurs to cause permeability of the electromagnetic wave to be deteriorated and phases of spatial frequency components to be shifted, thereby significantly deteriorating an imaging resolution, a resolution, and the like.

In the photomask according to the exemplary embodiment, since the photomask using an optimized negative refractive-index meta material may be described by the optical transfer function (OTF) of Equation 1, when the condition is regulated through FIG. 15 and Equation 1, an optimized photomask may be formed for supressing passage of energy derived from the complex light through the photomask in regions where such supression is desired.

Figure 16:
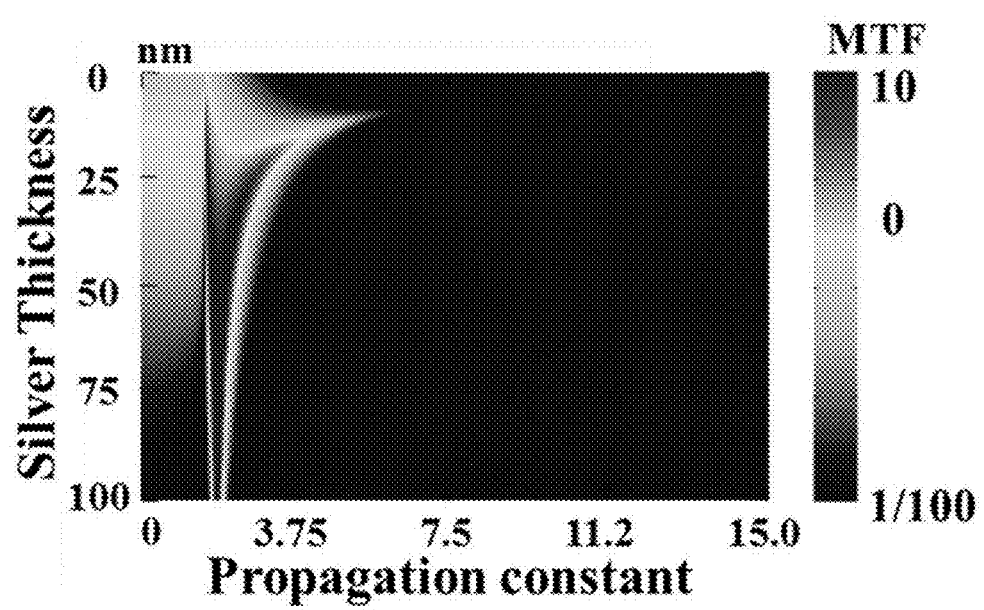
Figure 17:
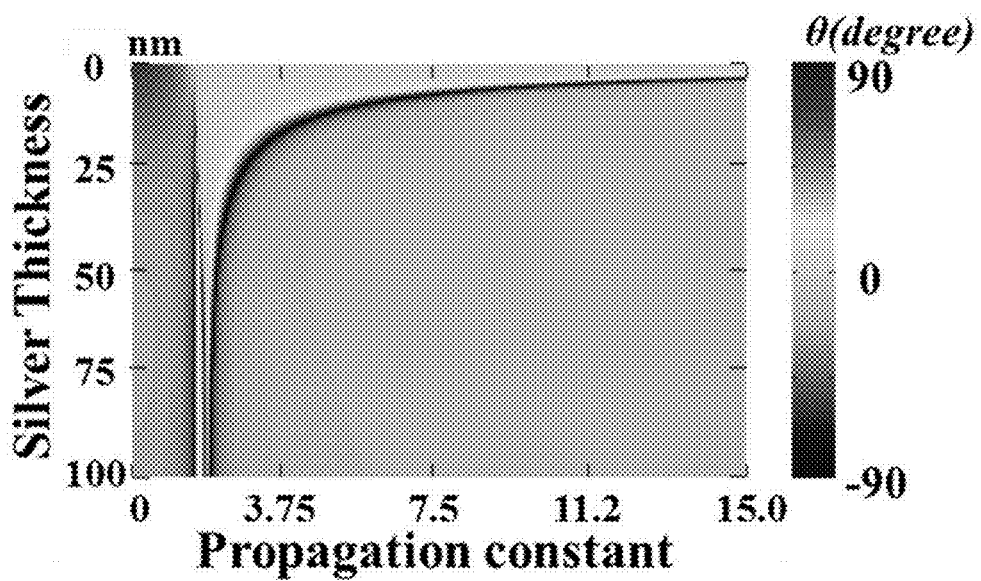

Each of FIGS. 16 and 17 shows as a function of silver thickness, the magnitude (horizontal axis) of the information transfer wave vector Kz and the modulation transfer function (MTF) and the phase transfer function (PTF) depending on the thickness (vertical axis) of silver when silver is used as the negative refractive-index meta material layer 130.

Referring to the graphs of FIGS. 16 and 17, it can be verified that the values of the modulation transfer function (MTF) and the phase transfer function (PTF) varies depending on the thickness of silver. Further, since the two graphs may also vary depending on the width of the opaque pattern 110 of the photomask, the photomask is optimized by considering the width. In FIG. 16, it is preferable that horizontal variation in the value of the modulation transfer function (MTF) is wide. Meanwhile, the phase transfer function (PTF) also varies in FIG. 17, but since the wavelengths in the legacy light exposer which is actually used are fixed, the variation in the phase transfer function (PTF) is not significant.

Further, the silver thickness should be determined by considering even a penetration depth of silver in order to optimize the photomask. Since the value of the OTF varies depending on the thickness, it is possible to obtain the same effect as a method of controlling a phase by changing a value of the wavelength.

That is, an original active phase controlling method is much related with the light source in imaging transfer. In other words, the light source is changed in order to control the phase. However, since the complex wavelengths of the legacy light exposer used in the display device and the MEMS process are determined at all times, there is a difficulty in forming the optimized photomask by the general active phase controlling method. Therefore, in the exemplary embodiment of the present teachings, a method of acquiring better photolithography imaging in the same light source by changing the thickness of the negative refractive-index meta material layer 130 is used instead of the method of changing the light source. As the method capable of controlling the phase in the process in which the wavelength is fixed, the method presented in the exemplary embodiment of the present invention may be unique.

Figure 18:
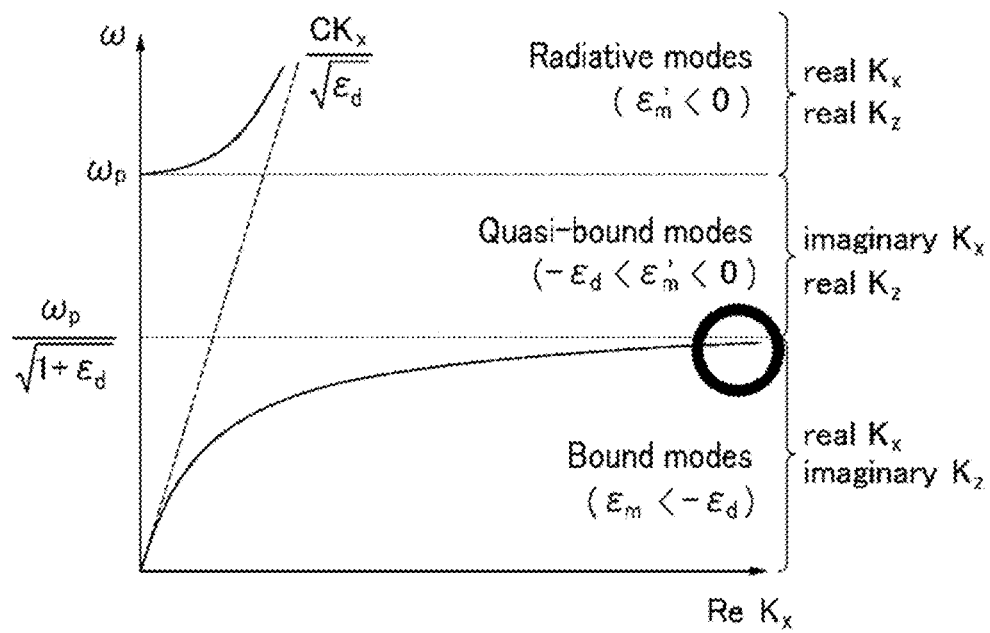
Figure 18:
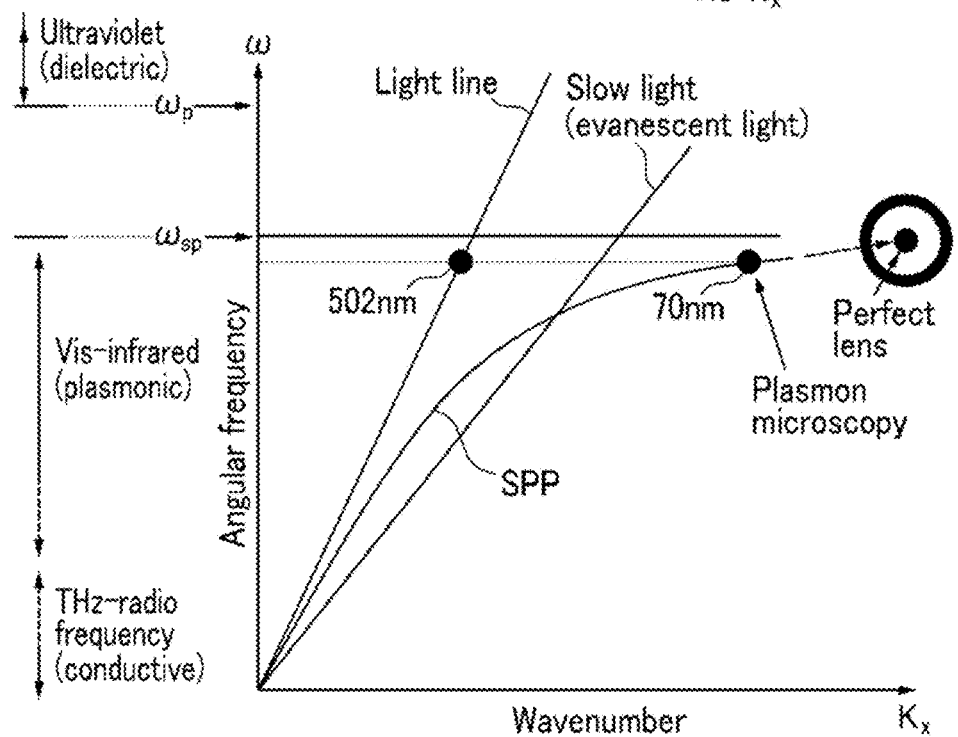
Figure 19:
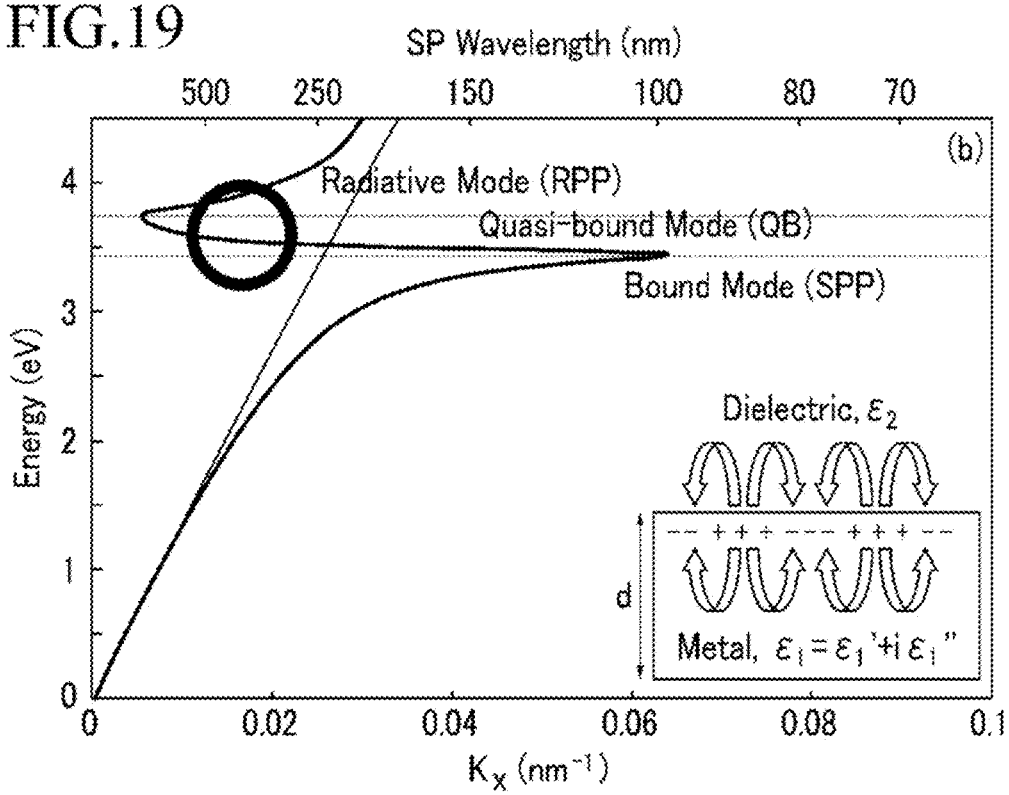
Figure 19:
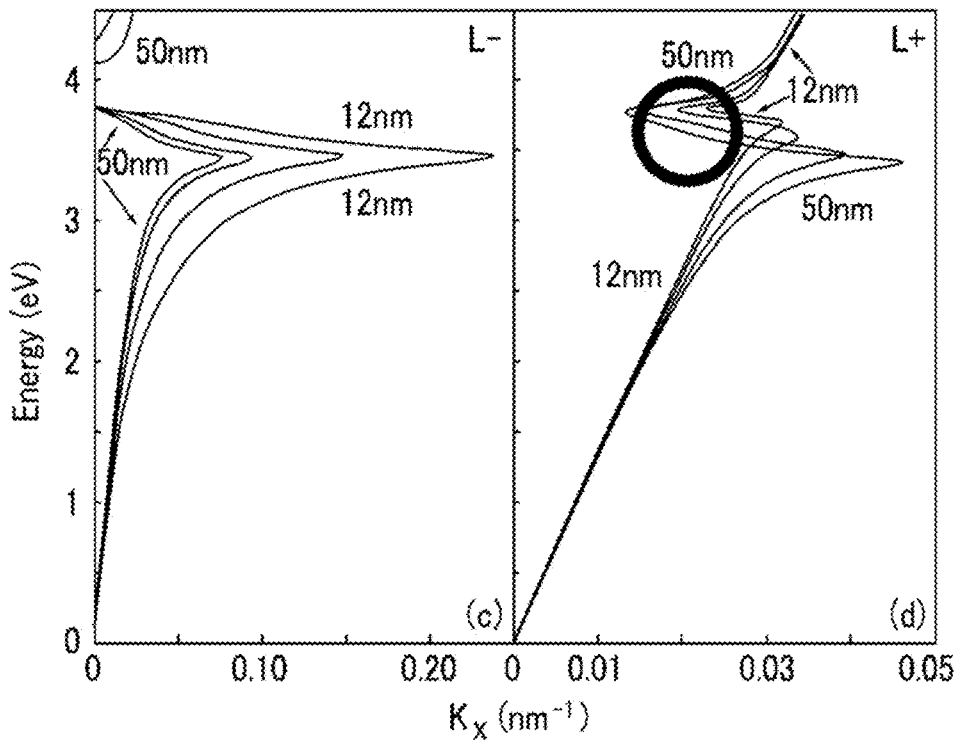

Meanwhile, in the case of the photomask according to the exemplary embodiment of the present disclosure of invention, an optimal photomask is formed by operating in a Quasi-bound mode as a dispersion mode as shown in FIGS. 18 and 19.

The photomask according to the exemplary embodiment of the present disclosure of invention is implemented by a surface plasmonic phenomenon between a metallic thin film and a dielectric and FIG. 18 illustrates dispersion of the surface plasmonic phenomenon between the metallic thin film and the dielectric. An existing super lens needs to use high frequency surface Plasmon having the high spatial frequency kx in order to form a pattern smaller than the wavelength. As a result, a conventional goal of a corresponding super lens design is to position a desired wavelength of light at the end of a dispersion graph of a bound mode in a desired wavelength by controlling the thicknesses and materials of the dielectric and the metal. (marked with a circle) Therefore, the thickness of a symmetric lens having a shape in which one dielectric covers both surfaces of the metal is designed to reduce loss and allow wave-vector kz to have a maximum value at a desired wavelength through the design in order to acquire the bound mode.

Referring to the graph shown in the upper part of FIG. 18, since no solid line exists in the Quasi-bound mode (there is a discontinuity), it is illustrated as if a corresponding mode does not exist. The reason therefor is that the graph of FIG. 18 is not based on data by an actual experiment but is simulated on an ideal assumption.

However, when the actual experiment is performed, the Quasi-bound mode connecting the bound mode and a radiative mode exists (there is no discontinuity) like a part of the curve marked with the center of the dark circle in FIG. 19.

Further, in the photomask according to the exemplary embodiment of the present teachings, since a pattern much larger than the wavelength should be formed unlike the existing (conventionally designed) super lens, negative refraction should be acquired in a range having a low spatial frequency kx (low frequency-surface Plasmon). That is, as shown in FIG. 19, the lens should be designed to operate in the Quasi-bound mode (QB-mode) marked with the circle in FIG. 19, not in the bound mode considered in convetionally designing the existing super lens.

As shown in FIG. 19, in the Quasi bound mode, as the value of the spatial frequency kx decreases, energy eV of the electromagnetic wave increases. Due to such a characteristic, the Quasi-bound mode is different from the bound mode and the radiative mode which are other modes. Further, a negative refractive-index meta material for the photomask according to the exemplary embodiment of the present disclosure should have the negative refractive index while the spatial frequency kx has a low value and the value of the spatial frequency kx may be preferably in the range of 0.005 to 0.03.

In the QB-mode, since Kz becomes a real number, light passing through the unconventionally-designed super lens is not immediately attenuated but limitatively irradiated to a far field, and as a result, an image may be transferred far away unlike the existing conventional super lens. Therefore, the photomask according to the exemplary embodiment of the present teachings may be spaced apart (by gap d) from the photoresist 210 of the work target substrate by a predetermined distance and the distance d has a value which is more than 0 and equal to or less than 35 μm.

Further, in the photomask according to the exemplary embodiment of the present teachings, an asymmetric design in which a dielectric layer covers the periphery of the metal (fills in the voids) is required.

Referring to a physical principle with respect to the aforementioned result, a pattern of a photomask has the spatial frequency kx. When light propagates the pattern, the light propagates the pattern through an equation for the information transfer wave vector kz shown below.

$$k_z = +i\sqrt{mk_x^2 - \omega^2 c^{-2}}, \omega^2 c_0^{-2} < k_x^2, m = 0, 1, 2 \ldots$$

$$k_z = +i\sqrt{mk_x^2 - \omega^2 c^{-2}}, \omega^2 c_0^{-2} < k_x^2, m = 0, 1, 2 \quad \text{[Equation 2]}$$

Herein, $\omega^2 c^{-2}$ represents a value for an incident wave and m represents a harmonic.

Further, $mk_x^2$ represents a patterning spatial frequency and a value thereof exists as a Fourier-series harmonic and as a high-dimensional harmonic value is transferred, the image is accurately transferred. Herein, the limit of the resolution means that no light existing as the harmonic is transferred to the image plane. However, in general, even light of the harmonic which is not transferred is also amplified by the exemplary embodiment of the present invention to be transferred to the image plane, and as a result, an accurate image can be transferred and the minute pattern which exceeds the resolution of the optical system can be formed.

Figure 20:
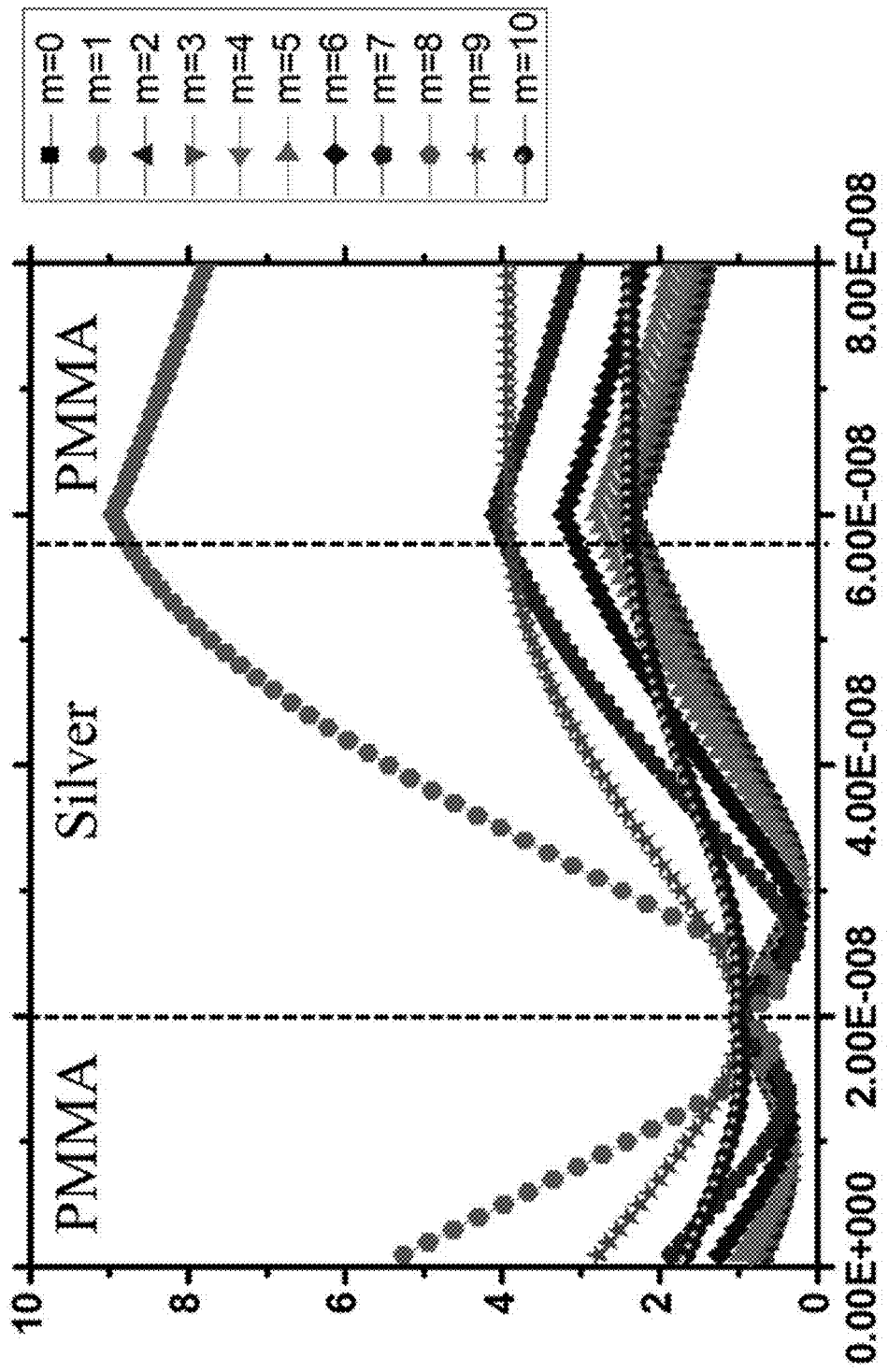

FIG. 20 shows that the simulated value varies as the information transfer wave vector kz passes through the first dielectric layer 120, the negative refractive-index meta material layer 130, and then the second dielectric layer 140. Herein, the first dielectric layer 120 is made of PMMA and has a thickness of 20 μm, the negative refractive-index meta material layer 130 is made of silver (Ag) and has a thickness of 40 μm, and the second dielectric layer 140 is made of PMMA and has a thickness of 20 μm. Further, each graph of FIG. 20 relates to a respective m value as shown in the side legend.

In general, as the m value increases, the magnitude of the information transfer wave vector kz also decreases and light is propagated up to the photoresist 210 until the value of m=7 at a line width of 1 μm. However, the light is not propagated (it is blocked) and the evanescence wave is therefore not transferred up to the plane of the photoresist 210 from m=8. But, when the photomask using the negative refractive-index meta material layer 130 is used in accordance with what is shown in FIG. 20, the evanescence wave after m=8 is restored, and as a result, information is transferred up to the photoreisst 210 and an imaging limitation generated in the optical system can be overcome. Even in FIG. 20, when m=8, the evanescence wave to be decayed is not decayed, and as a result, it can be verified that the value increases sharply. Even when m is 9 and 10, the value decreases as compared to the case in which m is 8, but it can be verified that the value is relatively larger than a case in which the m is in the range of 0 to 7, and as a result, it can be verified that the evanescence wave is not partially decayed at the plane (e.g., focal plane) of the photoresist.

Figure 21:
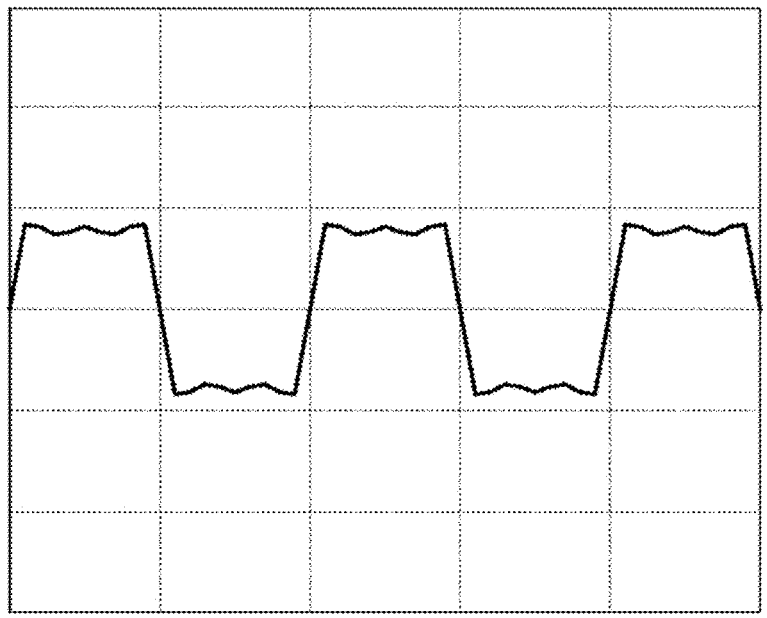
Figure 22:
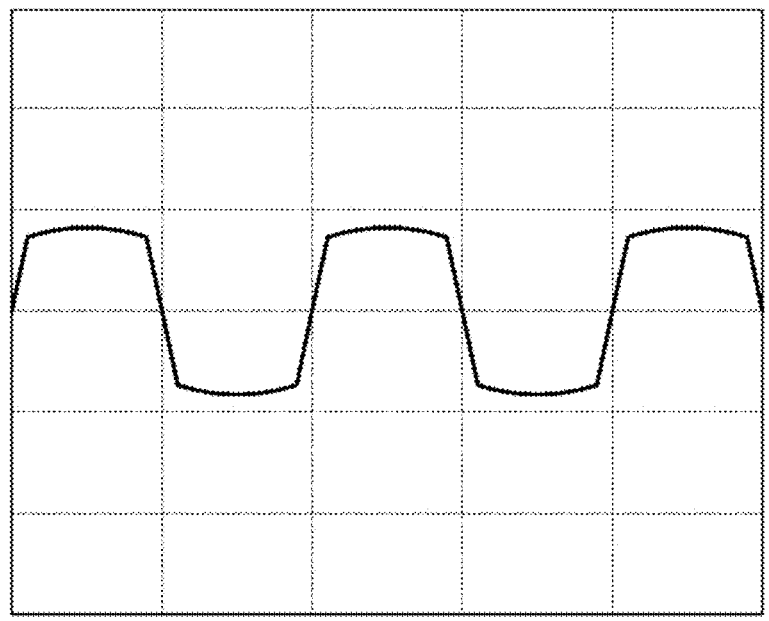
Figure 23:
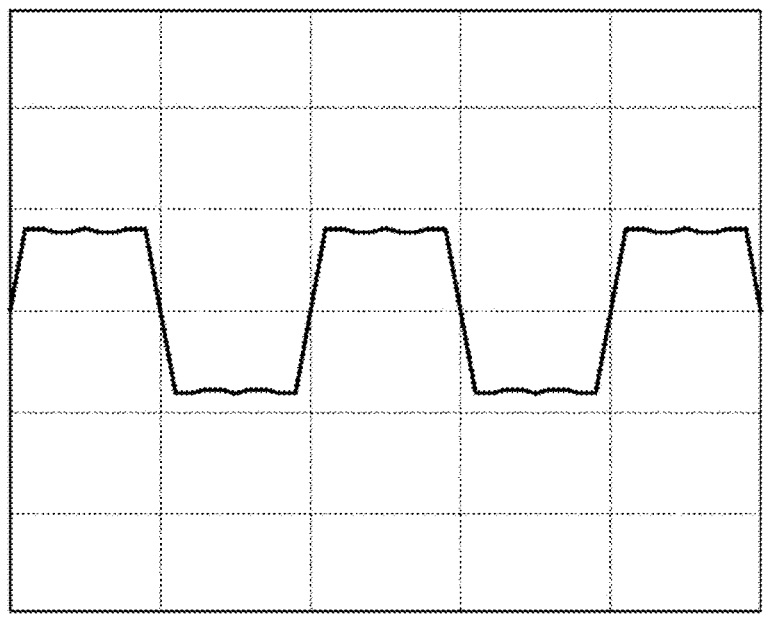

Meanwhile, in FIGS. 21 to 23, a pattern in which the value of the information transfer wave vector kz is transferred to the image plane is shown through a calculation.

FIG. 21 is a graph illustrating the sum of total 7 information transfer wave vectors kz when m is in the range of 1 to 7, FIG. 22 is a graph illustrating the sum of total 9 information transfer wave vectors kz when m is in the range of 1 to 9, and FIG. 23 is a graph illustrating the sum of total 16 information transfer wave vectors kz when m is in the range of 1 to 16.

As shown in FIGS. 21 to 23, as m included in the information transfer wave vector kz increases, the transferred pattern is more accurate.

Hereinafter, differences depending on a photolithography method and a characteristic of the present teachings will be described with reference to FIG. 24.

Figure 24:
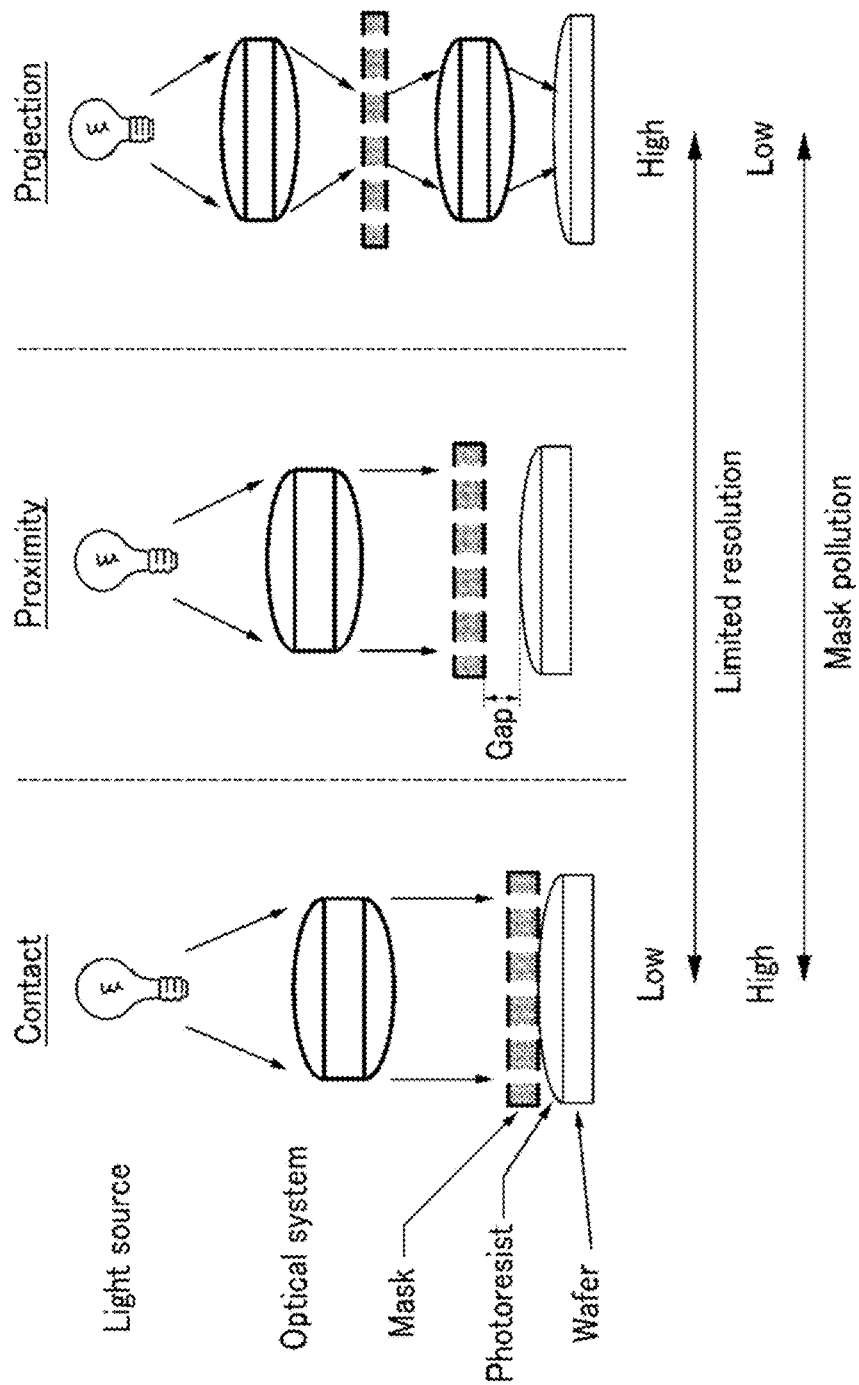
FIG. 24 is a diagram illustrating differences in an optical system and a characteristic depending on a photolithography method.

FIG. 24 is a schematic diagram illustrating differences in an optical system and a characteristic depending on a photolithography method used.

As shown in FIG. 24, the different photolithography methods may be largely classified into three methods and distinguished according to the distance between the mask and the photoresist of the substrate.

First, in a contact method, the photoresist and the mask are substantially in contact with each other and a gap therebetween is several nanometers. In this case, the optical system exists only between the light source and the mask.

Meanwhile, in a projection method (right side schematic representation), when the photoresist and the mask are distant from each other, an optical system may be positioned even between the mask and the photoresist.

Lastly, in a proximity method (middle schematic representation), which is an intermediate method between that of the contact method and of the projection method, the photoresist and the mask are spaced apart from each other by the micrometers range distance of d (Gap). Since the photomask according to the exemplary embodiment of the present teachings has a Gap (of distance value d) which is more than 0 and equal to or less than 35 μm from the photoresist, the photomask is based on the proximity method. That is, the present teachings may be applied in the range up to the proximity method, starting from the contact method. The reason therefor is that the present teachings can be applied within a scope in which the evanescence wave is not decayd. The largest difference between the contact method in the related art and the photomask according to the present disclosure of invention is in that photolithography is performed by operating in the Quasi-bound mode.

That is, the methods shown in FIG. 24 are different from each other in a limited resolution generated from the optical system due to the difference in gap between the mask and the photoresist and the contact method is generally used in order to form the minute pattern, but the proximity method may also be used in addition to the contact method in the exemplary embodiment of the present disclosure of invention.

Therefore, in the exemplary embodiment of the present teachings, since a proximity-field optical phenomenon (a distance which is more than 0 and equal to or less than 35 μm) generated due to the Plasmonic resonance or phonon resonance has a characteristic (the evanescence wave is not decayd) which cannot be observed in existing beam optics, a high resolution can be implemented.

Further, since the photomask according to the exemplary embodiment of the present disclosure of invention is used to manufacture the display device, the photomask should be used for patterning a large-sized substrate, and as a result, this method is different from a diffraction limit overcoming method in the related art used only in transferring a pattern of several tens of a nano unit.

Hereinafter, a manufacturing method of a substrate in which a pattern is formed in a work target by using a photomask according to an exemplary embodiment of the present invention will be described with reference to FIG. 25.

Figure 25:
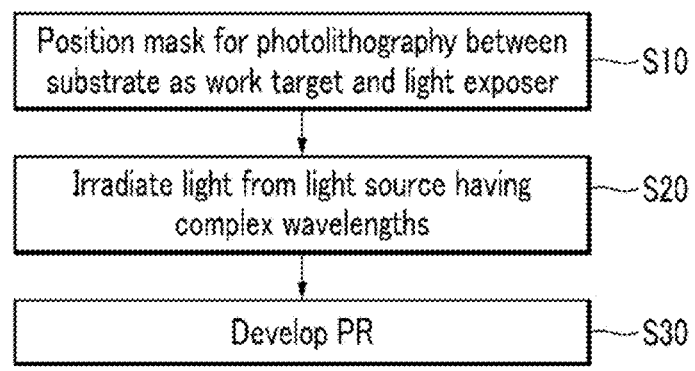
FIG. 25 is a flowchart illustrating a method of manufacturing a substrate by using a photomask according to an exemplary embodiment of the present disclosure.

FIG. 25 is a flowchart illustrating a method of manufacturing a substrate by using a photomask according to an exemplary embodiment.

First, the photomask should be positioned between a substrate as a work target and the photomask in order to form a pattern on the substrate as the work target by using the photomask according to the exemplary embodiment of the present invention. (S10)

Herein, a layer (for example, photoresist) having photosensitivity is formed on the substrate as the work target. Further, a legacy light exposer used in the exemplary embodiment of the present disclosure of invention has a light source having complex wavelengths.

In particular, in the exemplary embodiment, a gap (d) between the photomask and the substrate as the work target is more than 0 but equal to or less than 35 μm.

Thereafter, light is irradiated to the photomask by turning on the light source having the complex wavelengths of the light exposer. (S20) Only some of the light irradiated to the photomask penetrates to be transferred to the photoresist on the substrate as the work target while other portions are accurately suppressd from transferring through.

In the exemplary embodiment of the present disclosure of invention, a first dielectric layer 120 and a negative refractive-index meta material layer 130 are positioned on a general mask structure (may include a second dielectric layer 140) and surface plasmonic resonance or phonon resonance are induced to define an evanescence wave which exponentially decayed according to a propagation distance of an electromagnetic wave and the method uses the decayed evanescence wave phenomenon for accurate suppression of light transfer in a photolithography process.

Thereafter, a pattern depending on information on the mask is formed by developing the photoresist. (S30) Thereafter, a desired pattern is formed through etching.

While this disclosure of invention has been presented in connection with what is presently considered to be practical exemplary embodiments, it is to be understood that the teachings are not limited to the disclosed embodiments, but, on the contrary, they are intended to cover various modifications and equivalent arrangements included within the spirit and scope of the disclosure.

What is claimed is:

1. A photomask comprising:
 a substrate;
 an opaque pattern formed on the substrate;
 a first dielectric layer formed on the substrate and on the opaque pattern; and
 a negative refractive-index meta material layer formed on the first dielectric layer, associated with an optical transfer function that depends on a spatial frequency, and having a negative refractive index that corresponds to a value of the spatial frequency that is in a range of 0.005 $nm^{-1}$ to 0.03 $nm^{-1}$,
 wherein the photomask is structured to operate in a Quasi-bound mode as a dispersion mode, and
 wherein a gap between the uppermost layer of a work target and the photomask is more than 0 and equal to or less than 35 μm.

2. The photomask of claim 1,
wherein in the Quasi bound mode, as the spatial frequency decreases, energy of an induced electromagnetic wave increases.

3. The photomask of claim 1, further comprising a second dielectric layer formed of a dielectric material, wherein the negative refractive-index meta material layer is disposed between the substrate and the second dielectric layer, and wherein the first dielectric layer is formed of the dielectric material.

4. The photomask of claim 1, wherein the negative refractive-index meta material layer is thicker than the first dielectric layer.

5. The photomask of claim 1, further comprising:
a second dielectric layer formed of polymethyl methacrylate, wherein the negative refractive-index meta material layer is disposed between the substrate and the second dielectric layer.

* * * * *